US009252503B2

(12) United States Patent
Nolletti

(10) Patent No.: US 9,252,503 B2
(45) Date of Patent: Feb. 2, 2016

(54) GROUNDING DEVICE HAVING A GROUNDING PLATE AND AN INSULATED CONNECTING WIRE

(75) Inventor: Vincent Nolletti, Fresno, CA (US)

(73) Assignee: PAIGE ELECTRIC COMPANY, LP, Union, NJ (US)

( * ) Notice: Subject to any disclaimer, the term of this patent is extended or adjusted under 35 U.S.C. 154(b) by 1111 days.

(21) Appl. No.: 12/833,656

(22) Filed: Jul. 9, 2010

(65) Prior Publication Data

US 2012/0007620 A1 Jan. 12, 2012

(51) Int. Cl.
*G01R 27/08* (2006.01)
*H01R 4/02* (2006.01)
*H01R 4/64* (2006.01)

(52) U.S. Cl.
CPC . *H01R 4/029* (2013.01); *H01R 4/64* (2013.01)

(58) Field of Classification Search
CPC .... H01L 23/62; H05K 9/0039; H05K 1/0224; H05K 1/0257; H05K 9/0064; H05K 9/0067; H02G 13/00; H02G 13/80; H02G 13/40; H02G 7/22; H01R 13/6666; H01R 4/64; H01R 24/48; H01R 13/648; H01R 4/029; G01R 31/025; G01R 31/2827; G01R 31/1236; H05F 1/00; H04L 29/14; H04L 69/40; Y10T 29/4913; G03G 15/04045; G03G 15/321; G03G 15/326; H05C 1/00
See application file for complete search history.

(56) References Cited

U.S. PATENT DOCUMENTS

| | | | | |
|---|---|---|---|---|
| 2,977,484 A * | 3/1961 | Sterzer et al. | 326/99 |
| 3,578,982 A * | 5/1971 | Nelson | 307/95 |
| 5,002,502 A * | 3/1991 | Hill | 439/536 |
| 6,741,438 B2 * | 5/2004 | Sakai | 361/117 |
| 8,081,415 B2 * | 12/2011 | Nolletti | 361/220 |
| 2006/0254806 A1 * | 11/2006 | White et al. | 174/135 |
| 2012/0200523 A1 * | 8/2012 | Westhues | 345/174 |

FOREIGN PATENT DOCUMENTS

| | | | |
|---|---|---|---|
| JP | 10-112397 A | * | 4/1998 |
| JP | 410112397 A | * | 4/1998 |

OTHER PUBLICATIONS

David L. Heiserman, "installing electrical grounds",Apr. 19, 2005, SweetHaven Publsihing Services, pp. 1-3.*

* cited by examiner

*Primary Examiner* — Vinh Nguyen
(74) *Attorney, Agent, or Firm* — Cook Alex Ltd.

(57) ABSTRACT

An electrical grounding device can have a grounding plate and an insulated connecting wire. Having an insulated connecting wire reduces or prevents corrosion of the connecting wire by the surrounding underground soil. A grounding assembly is also provided and can have such a grounding device. The grounding assembly can include additional grounding devices which can also have an insulated connecting wire. A method of measuring resistance to ground of a grounding device of a grounding assembly having a multiple grounding devices and one or more bonding wires routed through a conduit is also disclosed. Having all but one of the connecting wires and bonding wires insulated or insulating all the connecting wires of the grounding devices of the grounding assembly allows measurement of resistance to ground by electrically disconnecting all but the connecting wire of the grounding device to be tested, contacting one terminal of an ohm meter to the connecting wire of the grounding device to be tested and contacting the other terminal of the ohm meter to the earth or ground, and reading the ohm meter.

9 Claims, 2 Drawing Sheets

GROUNDING DEVICE HAVING A GROUNDING PLATE AND AN INSULATED CONNECTING WIRE

BACKGROUND

The present disclosure relates to a grounding assembly for electronic equipment and a method for testing the resistance to ground of a grounding device in such assemblies. In particular, the disclosure relates to a grounding device and a grounding assembly having such a grounding device for use with outdoor electrical equipment that is subject to being damaged by lightning and a method for testing the resistance to ground of such a grounding device. An example of such electrical equipment is the electronic control systems used on underground irrigation systems, such as those installed on golf courses and the like.

Irrigation systems include numerous sprinkler heads and controllers located throughout a property. The controllers typically include a solenoid valve and one or more circuit boards which are typically connected to a central control computer and a power source by wires buried under ground. Lightning striking the ground far from a particular controller can induce voltage spikes in the wires leading to the controller that can destroy its circuit boards. Lightning arrestors are typically incorporated in such equipment to prevent this but for such arrestors to protect the equipment adequately they must have an effective connection to ground. Typically outdoor electrical systems, and especially irrigation systems with electronic controllers, include grounding assemblies which have multiple grounding devices. For further protection of electrically connected outdoor equipment such as irrigation systems the grounding assemblies of the controllers are connected or bonded to each other for added protection.

U.S. Pat. No. 8,081,415, the disclosure of which is incorporated herein by reference in its entirety, discloses various effective grounding assemblies which can be used in accordance applicable electrical codes. The grounding assemblies disclosed therein typically include two grounding devices for each of the controllers. These grounding devices can include a grounding rod and a grounding plate. When the grounding plate is buried in the soil it is surrounded by a suitable amount of a grounding enhancement backfill material, such as the backfill products sold under the trademarks PowerSet or PowerFill by Loresco International of Hattiesburg, MS. The backfill material enhances the conductivity between the ground plate and the surrounding soil.

The irrigation controller is typically enclosed in an above-ground housing which rests on a concrete pad. A conduit extends from the housing through the pad to an underground location. Underground wires extend through the conduit to electrically connect the controller to a power source and a central control computer. The controller includes a lighting protection board which is electrically connected to the grounding assembly. The grounding assembly can include a bus bar, a bridging wire electrically connecting the bus bar to the lighting protection board, a first grounding wire electrically connecting the bus bar to a first grounding device (e.g., a grounding plate) buried in the soil, a second grounding wire electrically connecting the bus bar to a second grounding device (e.g., a grounding rod) buried in the soil, and first and second bonding wires each electrically connecting the bus bar to either the ground of adjacent controllers or to a power supply ground. Bare copper wires have been used for the grounding and bonding wires, since they are connecting grounding devices or grounding assemblies of adjacent controllers. The grounding and bonding wires extend through the conduit from a location adjacent the bus bar to below ground level where the grounding and bonding wires emerge and separate towards their individual destinations.

In certain installations the grounding wires can be exposed to harsh soil environments that can result in premature corrosion of the grounding wires. In particular, it has been found that the interface between the grounding enhancement backfill material and the surrounding native soil is a harsh environment from a corrosion standpoint. Where the bare grounding wire emerges from the grounding enhancement backfill material and enters the surrounding native soil the bare grounding wire is particularly susceptible to corrosion. This can reduce the effectiveness of the ground.

In addition, when traditional bare grounding and bonding wires are routed through a conduit, testing of the resistance to ground of any individual wire can be frustrated as contact between the wires may occur within the conduit which can alter the circuit intended to be tested. Contact between the bare grounding and bonding wires and/or the conduit can result in false or ineffective testing of the resistance to ground measurement.

SUMMARY

In one aspect of the present disclosure a grounding device comprising a grounding plate and an insulated connecting wire is provided. The insulated connecting wire resists corrosion and makes it possible to measure the earth to ground resistance through the connecting wire.

In another aspect of the present disclosure a grounding assembly for an electronic device is provided. The grounding assembly includes a grounding plate and an insulated grounding wire electrically connected to the ground plate and the electronic device.

In yet another aspect of the present disclosure a method for measuring the resistance to ground of a grounding device is provided. The grounding assembly includes a grounding plate installed in the ground, a grounding rod installed in the ground, a first wire electrically connecting the grounding plate to the electronic device and a second wire electrically connecting the grounding rod to the electronic device. The method includes the steps of providing insulated wire for at least one of the first and second wires, electrically disconnecting from the electronic device the other of the grounding plate or grounding rod to be tested, contacting one terminal of an ohm meter to the conductor portion of the wire electrically connecting one of the grounding plate and grounding rod to be tested, and placing a second terminal of the ohm meter into the ground and reading the ohm meter.

These and other desired benefits of the invention, including combinations of features thereof, will become apparent from the following description. It will be understood, however, that a device could still appropriate the claimed invention without accomplishing each and every one of these desired benefits, including those gleaned from the following description. The appended claims, not these desired benefits, define the subject matter of the invention.

DETAILED DESCRIPTION

Figure 1:
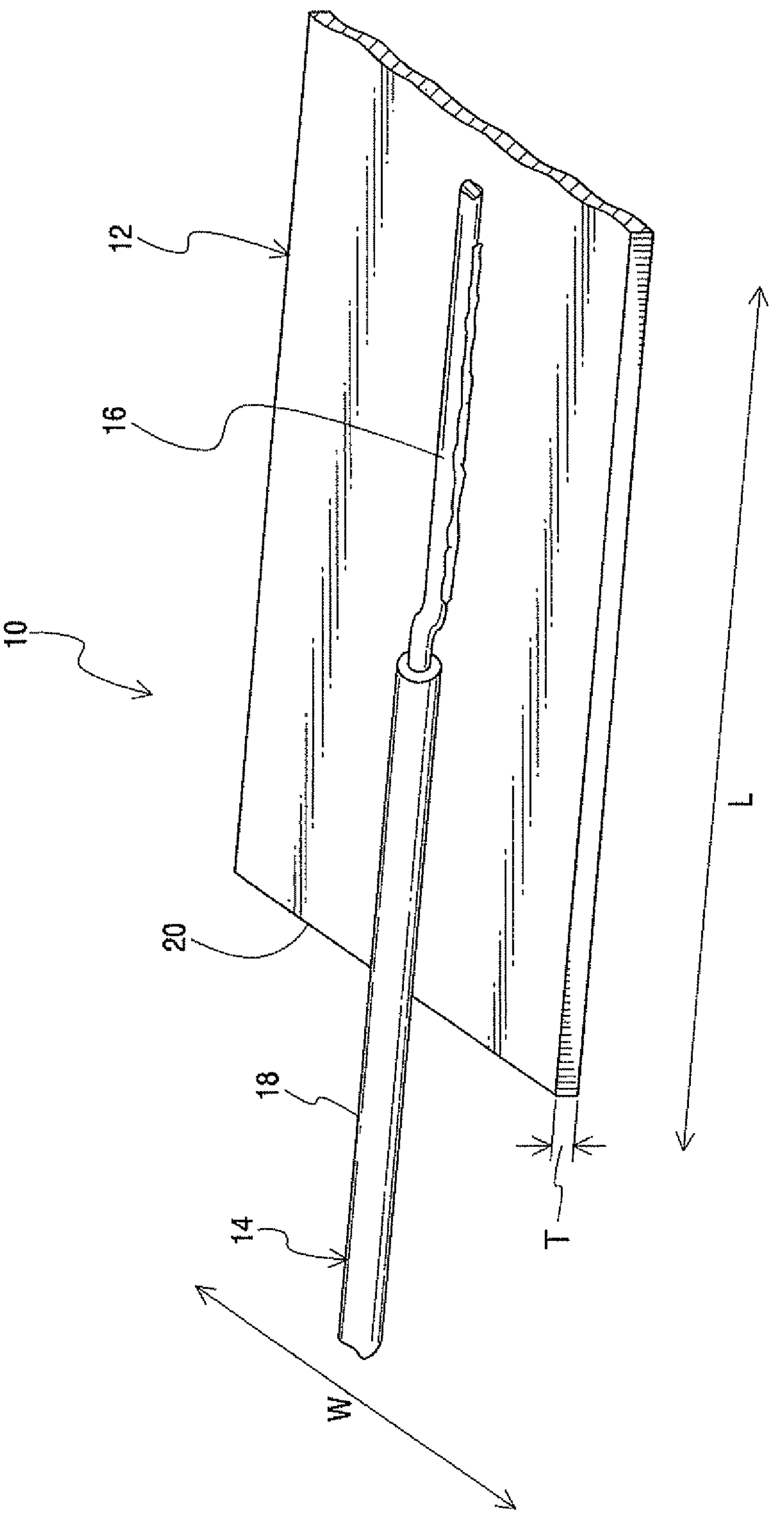
FIG. 1 is a perspective view of one embodiment of a grounding device according to the present disclosure.

FIG. 1 shows one embodiment of a grounding device according to the present disclosure. Grounding device 10 can have a grounding plate 12 and a connecting wire 14. In one embodiment, connecting wire 14 has a conductive core 16 and insulation 18 covering most of the conductive core 16. The conductive core is welded, soldered or otherwise attached to grounding plate 12. Preferably the insulation 18 extends onto the plate 12, i.e., it extends past the edge 20 of the grounding plate which the connecting wire crosses. In the illustrated embodiment, insulation 18 continues beyond edge 20 and contacts grounding plate 12. The end of the conductive core 16 is stripped of insulation where it is attached to the plate.

The grounding plate 12 and conductive core 16 of connecting wire 14 can be made of any highly conductive material such as a metal or metal alloy. In one embodiment a highly conductive copper alloy is used. Grounding plate 12 can have a selected length 'L', width 'W' and thickness 'T' depending on the application of use. Connecting wire 14 likewise can have a diameter and length selected depending on the application of use. In one embodiment, grounding device 10 is to be used in an electrically-controlled irrigation system. Accordingly, grounding plate 12 meets the requirements of Article 250.52(A)(7) of the 2008 NEC and is made of copper alloy. For reference purposes and not by way of limitation, the plate 12 may have a width 'W' of about four inches, a length 'L' of about ninety-six inches and a thickness 'T' of about 0.0625 inches. Connecting wire 14 can be a 6 AWG solid round copper wire and can have a continuous length of about twenty five feet. Connecting wire can also be welded to the grounding plate 12 using an approved exothermic welding process. However, in prior art grounding devices, a bare copper wire was used as the connecting wire. As the grounding plate and connecting wire are typically buried underground, harsh soil condition led to corrosion of bare wire. The grounding device 10 according to the present invention has an insulated connecting wire 14 to resist corrosion. There are other unexpected advantages to using insulated wire which will be described below. In one embodiment connecting wire 14 can be 6 AWG wire having a length of about twelve feet and green insulation with a yellow stripe. As mentioned, the insulation 18 can be stripped over a desired length to form approved welds to grounding plate 12.

Figure 2:
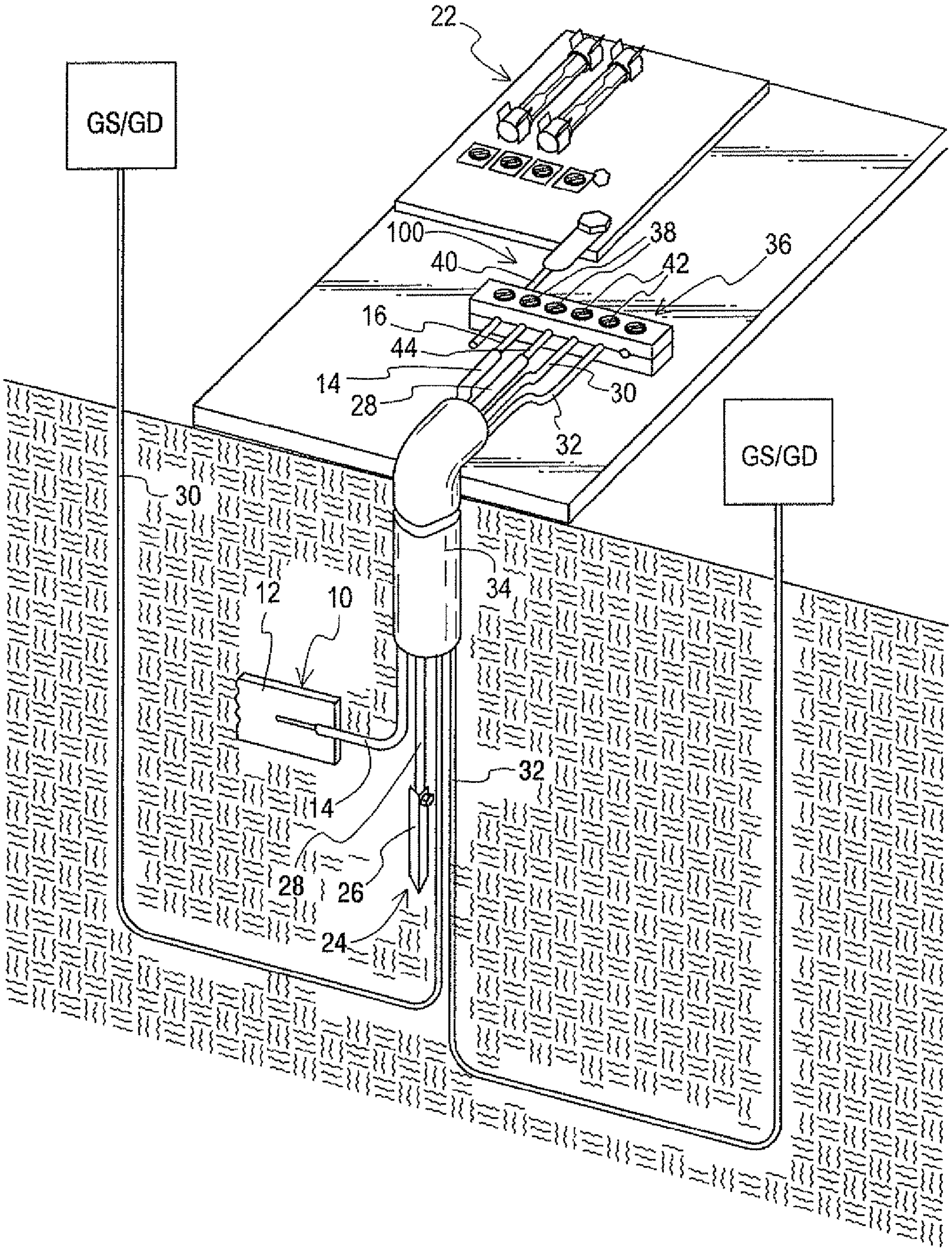
FIG. 2 is a schematic view of one embodiment of a grounding assembly according to the present disclosure.

FIG. 2 shows one embodiment of a grounding assembly 100 according to the present disclosure for electrical device 22. Device 22 is part of the irrigation controller and is mounted inside a housing that sits on a pad (not shown). Device 22 in the illustrated embodiment is a lightning protection board that contains lightning arrestors. It will be understood that other possible arrangements of the various circuit boards are possible and that the lightning protection components could be incorporated in boards having multiple functions, such as an output board or a communication system boards. It is connected to other boards (not shown) that contain the circuit elements for interpreting control signals from a central control computer and actuating one or more solenoid valves in accordance with the control signals. The lightning protection board 22 has components designed to protect it and the second board from lightning induced spikes coming in through any wire connected to the controller. The lightning protection board 22 has a ground lug affixed thereto.

The grounding assembly 100 can include one or more grounding devices. In the illustrated embodiment, grounding assembly 100 can have a first grounding device 10 and a second grounding device 24. First grounding device 10 can have a grounding plate 12 and a connecting wire 14 and second grounding device 24 can have a grounding rod 26 and connecting wire 28. Grounding assembly 100 can also include one or more bonding wires for connecting the grounding assembly 100 to adjacent grounding assemblies 'GS' and/or grounding devices 'GD' of the power supply which supplies power to the electrical equipment.

As shown in FIG. 2, grounding assembly 100 can have two bonding wires 30, 32. Conduit 34 extends through the pad and opens to the interior of the housing for receiving the connecting wires 14, 28 and bonding wires 30, 32. Conduit 34 can extend below the ground. Connecting wires 14, 28 are routed through the conduit 34 and exit conduit 34 underground for connection to grounding plate 12 and grounding rod 26, respectively. Likewise, bonding wires 30, 32 can be routed through conduit 34 and emerge from underground to be connected to a power supply grounding device or another grounding assembly of an adjacent controller.

Grounding assembly can also have a bus bar 36 for electrically connecting the grounding devices 10, 24 and bonding wires 30, 32 to board 22 via bridging wire 40. Bus bar 36 can have one or more openings 38 to receiving connecting wires of the grounding devices, bonding wires and bridging wire. The bare conductor portion of the wires can be inserted into the openings and secured by set screws 42 or other fasteners.

In prior grounding assemblies, connecting wires and bonding wires are bare copper wires. As discussed above, connecting wire 14 of grounding device 10 is an insulated wire to prevent corrosion of connecting wire 14. The same can apply to connecting wire 28 of grounding device 24. In the illustrated embodiment, grounding assembly 100, connecting wires 14, 28 are insulated wires. Connecting wire 14 can be a 6 AWG green with a yellow stripe insulated wire having a length selected depending on the application. In one embodiment, connecting wire 14 can be about twelve feet in length and in another embodiment it can be about twenty five feet in length. Connecting wire 28 can be a 6 AWG green insulated wire with no stripe to assist in differentiating the wires. In one embodiment, connecting wire 28 can be about twelve feet in length and in another embodiment it can be about twenty five feet in length.

A surprising advantage beyond corrosion resistance is also presented by having connecting wires 14, 28 insulated. Providing insulated connecting wires 14, 28 allows individual measurement of the resistance to ground of each of the grounding devices 10, 24.

In the typical prior art installation the bare copper wire connections of the grounding devices and bare bonding wires in a conduit results in the wires contacting one another. Thus, any attempt to measure resistance to ground of a particular grounding device could be frustrated by the contacting wires forming a circuit to ground other than the one whose resistance is desired to be measured. With insulated connecting wires 14, 28, an accurate measurement of resistance to ground can be made as follows. For example, when measuring the resistance to ground of a grounding device, one would first disconnect from the bus bar any bonding wires and connecting wires of second, third or more grounding devices, if present. Then, one terminal of an ohm meter can be placed in contact with the connecting wire of the grounding device to be measured and the second terminal of the ohm meter can be placed in or made to contact the soil. The meter can be read to determine the resistance to ground of the selected grounding device.

In the particular embodiment illustrated in FIG. 2 the method of measuring the resistance to ground of grounding device 10 can proceed as follows. First, bonding wires 30, 32 and connecting wire 28 are disconnected from bus bar 36 by loosening set screws 42 and pulling the wires free from electrical contact with the bus bar 36. Then, one terminal of an ohm meter (not shown) or other resistance meter can be placed in electrical contact with bus bar 36 or the conductive core 16 of connecting wire 14 of grounding device 10 and the second terminal of the ohm meter can be placed in or made to contact the soil. The meter can be read to determine the resistance to ground of grounding device 10. The same steps can be followed to measure the resistance to ground of grounding device 24 except instead of disconnecting wire 28, wire 28 remains connected to bus bar 36 and connecting wire 14 is disconnected from bus bar. Then one terminal of the ohm meter can be placed in electrical contact with bus bar 36 or the conductive core 44 of wire 28 and the other terminal can be placed in or made to contact the soil. The meter can then be read to determine the resistance to ground of grounding device 24.

In another embodiment, all but one of the connecting wires and bonding wires can be insulated wires to also permit accurate measurement of the resistance to ground of any of the grounding devices. Such an arrangement would prevent electrical contact within the conduit from frustrating the measurement of resistance to ground. In one embodiment, one of connecting wires 14, 28 can be insulated wire and all the bonding wires 30, 32 can be insulated wire. The method of measuring the resistance to ground of a particular grounding device can still proceed as described above.

As can be seen from the above description, the present disclosure has several different aspects, which are not limited to the specific structures shown in the attached drawings and which do not necessarily need to be used together. Variations of these concepts or structures may be embodied in other structures without departing from the present invention as set forth in the appended claims.

What is claimed is:

1. A grounding assembly for an electronic device, the grounding assembly comprising:

a grounding plate made of conductive material and having an exposed surface area of least two square feet;

an insulated first grounding wire electrically connected to the grounding plate and the electronic device; and a grounding rod and a second grounding wire electrically connected to the grounding rod and the electronic device.

2. The grounding assembly of claim 1 wherein the grounding plate is made of copper or a copper alloy.

3. The grounding assembly of claim 1 wherein the grounding plate and a conductive core of the insulated grounding wire are welded together.

4. The grounding assembly of claim 1 wherein the second grounding wire is insulated.

5. The grounding assembly of claim 4 further comprising a bus bar made of electrically conductive material for electrically connecting the grounding plate and grounding rod to the electronic device.

6. The grounding assembly of claim 5 wherein the bus bar has a first opening to receive the insulated grounding wire and second opening to receive the second grounding wire for electrically connecting the grounding plate and grounding rod to the electronic device.

7. The grounding assembly of claim 6 further comprising a bridging wire electrically connected to the electronic device and the bus bar, and the bus bar further comprising a third opening for receiving the bridging wire.

8. The grounding assembly of claim 7 wherein the grounding assembly further comprises at least one bonding wire for connecting the grounding assembly to either a grounding device of a power supply or another grounding assembly of an adjacent electronic device.

9. The grounding assembly of claim 8 wherein the grounding assembly comprises two bonding wires each received in fourth and fifth openings respectively of the bus bar wherein one bonding wire is electrically connectable to a bus bar of a grounding assembly of first adjacent electronic device and the second bonding wire electrically connectable to either a grounding device of a power supply or a bus bar of a grounding assembly of an adjacent electronic device.

* * * * *